United States Patent [19]

Peng et al.

[11] Patent Number: 5,754,471
[45] Date of Patent: May 19, 1998

[54] LOW POWER CMOS ARRAY FOR A PLD WITH PROGRAM AND ERASE USING CONTROLLED AVALANCHE INJECTION

[75] Inventors: Jack Zezhong Peng, San Jose, Calif.; Jonathan Lin, Milpitas, Calif.

[73] Assignee: Advanced Micro Devices, Inc., Sunnyvale, Calif.

[21] Appl. No.: 466,438

[22] Filed: Jun. 6, 1995

[51] Int. Cl.⁶ .................................................. G11C 16/02
[52] U.S. Cl. ........................... 365/185.1; 365/185.26; 365/185.29; 365/189.09
[58] Field of Search .......................... 365/189.09, 218, 365/185.26, 185.28, 185.29, 185.1

[56] References Cited

U.S. PATENT DOCUMENTS

| | | | |
|---|---|---|---|
| 4,829,203 | 5/1989 | Ashmore, jr. | 307/469 |
| 4,858,185 | 8/1989 | Kowshik et al. | 365/181 |
| 4,862,019 | 8/1989 | Ashmore, jr. | 307/469 |
| 4,866,307 | 9/1989 | Ashmore, jr. | 307/469 |
| 4,885,719 | 12/1989 | Brahmbhatt | 365/181 |
| 5,016,217 | 5/1991 | Brahmbhatt | 365/185.1 |
| 5,055,897 | 10/1991 | Canepa et al. | 365/185.1 X |
| 5,148,391 | 9/1992 | Zagar | 365/96 |
| 5,170,373 | 12/1992 | Doyle et al. | 365/185 |
| 5,220,533 | 6/1993 | Turner | 365/218 |
| 5,270,587 | 12/1993 | Zagar | 307/469 |
| 5,272,368 | 12/1993 | Turner et al. | 257/315 |
| 5,404,328 | 4/1995 | Takemae | 365/185 |
| 5,438,542 | 8/1995 | Atsumi et al. | 365/185.26 X |
| 5,594,687 | 1/1997 | Lin et al. | 365/185.1 |
| 5,596,524 | 1/1997 | Lin et al. | 365/185.1 |

*Primary Examiner*—Do Hyun Yoo
*Attorney, Agent, or Firm*—Fliesler Dubb Meyer & Lovejoy

[57] ABSTRACT

A low power CMOS array cell for use in a PLD device is disclosed. The cell utilizes controlled avalanche injection at the p-n junction of a transistor in the CMOS cell for programming and erasing, resulting in lower voltages than with Fowler-Nordheim tunneling and lower currents than channel hot carrier injection during program and erase. A depletion transistor having a gate connected to its source has a source-drain path supplying current to the CMOS cell to limit current required during avalanche injection.

6 Claims, 4 Drawing Sheets

5,754,471

LOW POWER CMOS ARRAY FOR A PLD WITH PROGRAM AND ERASE USING CONTROLLED AVALANCHE INJECTION

BACKGROUND OF THE INVENTION

1. Field of the Invention

The present invention generally relates to array cells and more particularly, the invention relates to circuitry for a CMOS array cell and a method for utilizing the circuitry for programming and erasing the cell.

2. Description of the Related Art

Typically in current technology, CMOS array cells for programmable logic devices (PLDs) are programmed and erased using Fowler-Nordheim tunneling (FNT) or channel hot carrier injection. A typical cell using FNT is depicted in FIG. 1. A CMOS inverter is formed with an NMOS transistor 10 and a PMOS transistor 12 with a merged floating gate 14. A capacitor 16 is coupled to the merged floating gate to form the array control gate (ACG) 18. A tunnel capacitor 20 is provided to charge and discharge the merged floating gate 14. A write signal applied to the gate 22 of pass transistor 24 controls programming and erasing of the floating gate 14 via the tunnel capacitor 20.

To program the cell of FIG. 1 (i.e., to add holes to the floating gate), the word control line 26 is raised to $V_{pp}$ (typically 12 v) and a voltage higher than $V_{pp}$ (typically 14 v) is applied to the gate 22 of pass transistor 24, turning "on" pass transistor 24. ACG 18, $V_{ssp}$ 28, and $V_{ssn}$ 30 are brought to ground. Electrons will then migrate off the floating gate 14 through the tunnel capacitor 20.

To erase the same array cell (i.e., add electrons to the floating gate), word control line 26 is brought to ground, and $V_{cc}$ (typically 5 V) is applied to gate 22 of pass transistor 24. ACG 18, $V_{ssp}$ 28, and $V_{ssn}$ 30 will be raised to $V_{pp}$. Electrons will thus migrate onto the floating gate 14 through tunnel capacitor 20.

While FNT is popular, it requires high voltages and causes damage to tunneling oxide layers through which electrons travel during program or erase. Further, if pass transistor 24 is not used, the cell is essentially a two-terminal device (i.e., only $V_{pp}$ and GND), which requires that all cells in an array be programmed or erased at the same time.

Channel hot electron (CHE) injection is depicted in FIG. 2. A single NMOS transistor 50 is shown. Transistor 50 has a floating gate 52 and a control gate 54, as well as a drain 58, a source 60 and a substrate 62. For CHE injection a potential difference is created between the drain 58 and the source 60 by applying, for instance, 6 volts to the drain 58 and grounding the source 60. A potential difference is also created between the drain 58 and the control gate 54, by, for instance, applying an additional voltage of 9 volts to the control gate 54 while grounding the substrate 62. A current will then flow in the channel region 56 between the source 60 and drain 58 creating a pinchoff region in the channel by applying the source to drain voltage difference. With the gate voltage further applied, electrons in the channel region 56 gain energy from the electric fields created and can then surmount the energy barrier (approx. 3.1 eV) existing at the substrate surface 64 and cross from the channel region 56 to the oxide layer 66 at the pinchoff region. Once in the oxide layer 66, the electrons are pulled to the floating gate 52, driven by the potential difference electric field across the oxide layer 66. Channel hot hole (CHH) injection is accomplished in a similar manner on a PMOS device.

While channel hot carrier injection is advantageous in the respect that it utilizes three terminals, allowing individual cells to be erased or programmed at a given time, channel hot carrier injection generates a high current (approximately 1 mA) on the source-drain current path, which is not desirable for maintaining a low power device.

SUMMARY OF THE INVENTION

The present invention utilizes lower voltages during program and erase than Fowler-Nordheim tunneling, as well as lower current than channel hot carrier injection, resulting in a low power array cell.

Further, during program and erase, the present invention provides an array cell utilizing three terminals, thus, individual cells may be selected and isolated for programming or erasing.

In an embodiment, the present invention further utilizes a CMOS cell so that zero power is consumed during a read operation.

The present invention is an array cell comprising a first transistor, having a floating gate and a source-drain current path, and a second programmable and erasable transistor, having a floating gate and a source-drain current path. The source-drain current path of the second transistor is coupled to the source-drain path of the first transistor. The floating gate of the first transistor may be merged with the floating gate of the second transistor. Further, the second transistor is programmed and erased using avalanche hot carrier injection at a p-n junction of the second transistor. In addition, a depletion transistor having a gate connected to its source has a source-drain path supplying current to the second transistor of the array cell to limit current during avalanche injection.

BRIEF DESCRIPTION OF THE DRAWINGS

Further details of the present invention are explained with the help of the attached drawings in which.

DETAILED DESCRIPTION OF THE INVENTION

Figure 1:
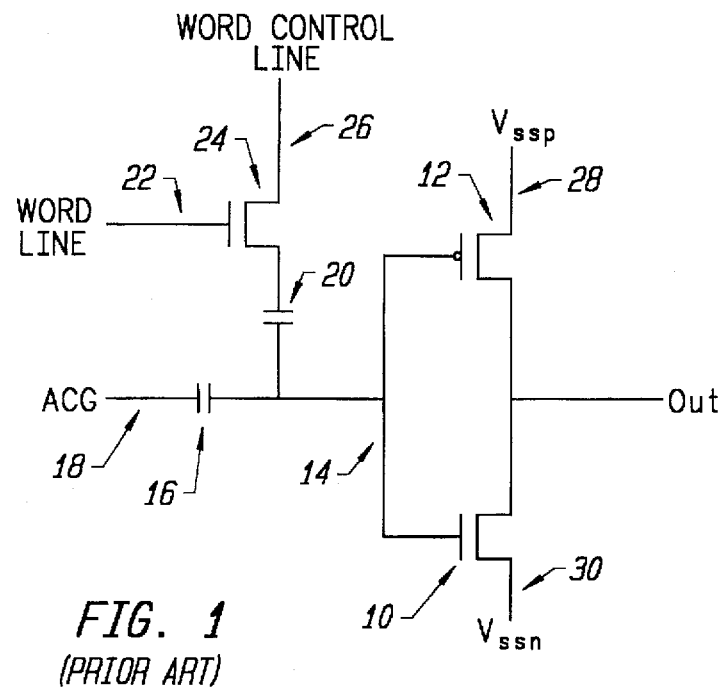
FIG. 1 is a schematic diagram illustrating a memory cell utilizing Fowler-Nordheim tunneling.
Figure 2:
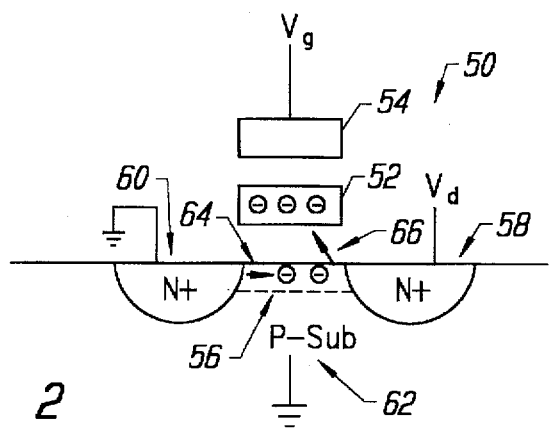
FIG. 2 is a partial, cross-sectional view of a transistor in a memory cell utilizing channel hot electron erase.
Figure 3:
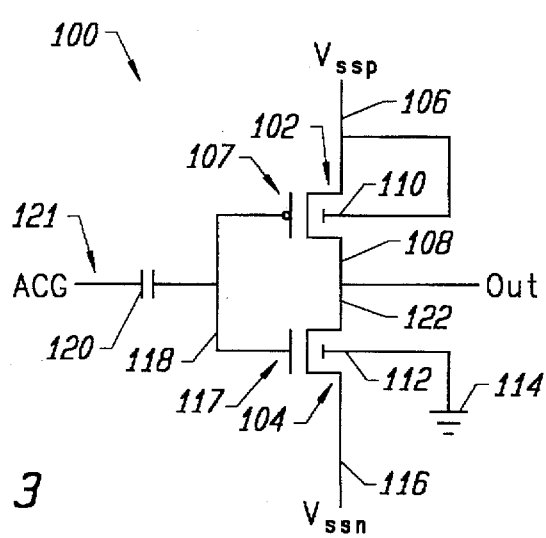
FIG. 3 is a schematic diagram of a CMOS array cell.

The present invention is a CMOS array cell configured to be programmed and erased utilizing controlled avalanche hot carrier injection. FIG. 3 shows an array cell formed by a CMOS inverter with a PMOS transistor 102 and an NMOS transistor 104. Drain 108 of transistor 102 is connected to drain 122 of transistor 104. The floating gates 107 and 117 of the respective transistors are merged to form merged floating gate 118. A capacitor 120 is coupled to the merged floating gate 118 to form the array control gate (ACG) 121.

Figure 4:
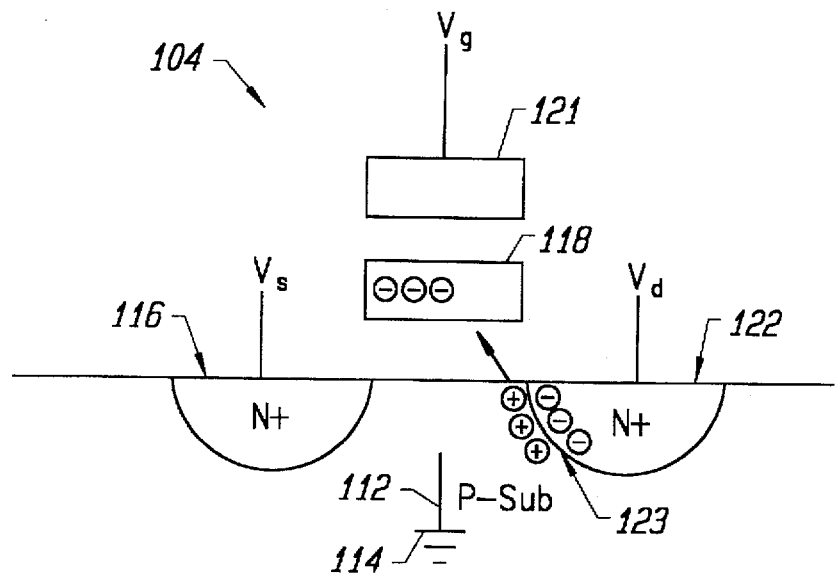
FIG. 4 is a partial, cross-sectional view of part of the array cell shown in FIG. 3, utilizing avalanche hot carrier injection.

It is desirable to use avalanche hot carrier injection to program and erase the cell of FIG. 3 as it will yield a lower power operation than other methods. Avalanche hot electron (AHE) injection is used to erase the array cell 100 by causing an avalanche breakdown in transistor 104, and is illustrated in FIG. 4. With AHE injection, no source-drain current is created. Rather, a high reverse-bias at p-n junction 123 is created by applying a high drain 122 to substrate 112 potential. (Source 116 may remain floating.) When the junction is reverse-biased and the oxide field is positive (i.e., gate potential is higher than the substrate), avalanche breakdown will occur, causing electrons generated at the p-n junction 123 to "inject" to the floating gate 118, thus erasing the cell 100. Similarly, if the oxide field is negative (i.e., the gate potential is lower than the substrate) holes generated at the p-n junction 123, rather than in the channel as in CHH injection, will inject to the floating gate 118, thus programming the cell 100 using avalanche hot hole (AHH) injection.

Figure 5:
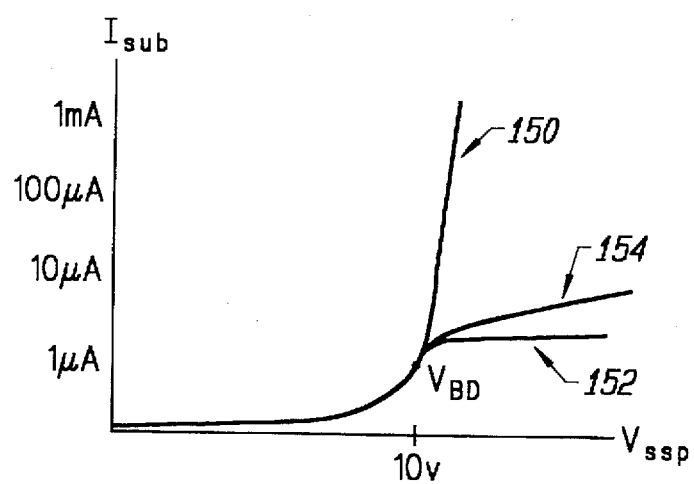
FIG. 5 is a graphical representation of a substrate current versus the voltage applied to an array cell during program and erase.

Although avalanche hot carrier injection uses lower voltages than other methods, one problem with using avalanche hot carrier injection is that a high substrate current ($I_{sub}$) may result. FIG. 5 shows a characteristic substrate current versus $V_{ssp}$ (the voltage applied at the drain 122 of transistor 104) applied for a particular cell during avalanche hot carrier injection. As shown by curve 150, breakdown occurs at a particular voltage $V_{BD}$, and current substantially increases when even slightly higher voltages are applied. Such a high $I_{sub}$ is undesirable as it will demand all of the current from the current supply (i.e., a charge pump), making it impossible for other cells to reach breakdown (as they will be deprived of current), and thus to be erased or programmed. In other words, only the cell at the lowest breakdown voltage will have sufficient current to be erased or programmed. Therefore, while it is desirable to use avalanche hot carrier injection for programming and erasing, breakdown current must be controlled.

Figure 6:
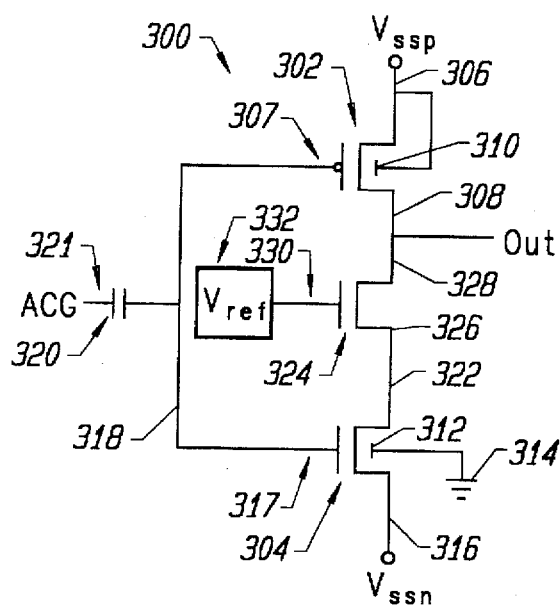
FIG. 6 is a schematic representation of one embodiment of the present invention.

One embodiment of the present invention is depicted in FIG. 6. Array cell 300 is composed of transistor 302, transistor 304, and transistor 324. Transistor 302 has a source 306, a drain 308 and a floating gate 307. The substrate 310 of transistor 302 is connected to the source 306 of transistor 302. Transistor 302 typically acts as a switchable current source, allowing current to pass from its source 306 to its drain 308 (in a source-drain current path) when the voltage applied between gate 307 and $V_{ssp}$ reaches a particular threshold voltage.

Transistor 304 has a source 316, a drain 322 and a floating gate 317. The substrate 312 of transistor 304 is connected to ground 314. Transistor 304 is the transistor utilized particularly for programming and erasing the cell using avalanche hot carrier injection.

Further, floating gates 307 and 317 are merged to form a single merged floating gate 318. A capacitor 320 is coupled to the merged floating gate 318 to form the array control gate (ACG) 321.

A third transistor 324 is coupled to the source-drain paths of transistor 302 and transistor 304. In the embodiment shown in FIG. 6, this coupling includes drain 328 of transistor 324 coupled to drain 308 of transistor 302, and source 326 of transistor 324 coupled to drain 322 of transistor 304.

A reference voltage generator 332 is coupled to gate 330 of transistor 324. Reference voltage generator 332 provides a reference voltage $V_{ref}$ to the gate 330 of transistor 324. By adjusting the reference voltage to the gate 330 of transistor 324, current flowing through the source-drain path of transistor 324 can essentially be regulated. Thus, during a program or erase function, current will be able to flow from the source-drain path of transistor 302 through the source-drain path of transistor 324 to transistor 304. However, by adjusting $V_{ref}$ the amount of current that reaches transistor 304 may be varied such that current does not significantly increase after breakdown occurs as shown by line 150 in FIG. 5, and, thus, current may be regulated.

Figure 7:
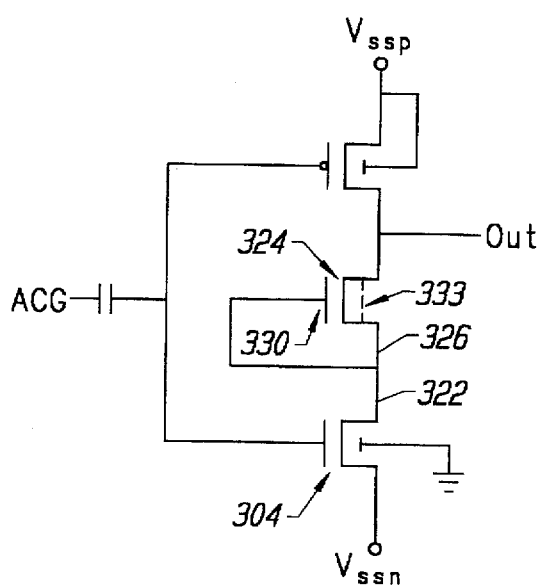
FIG. 7 is a schematic representation of a second embodiment of the present invention.

While applying a voltage at gate 330 of transistor 324 will regulate the current through the source-drain path of transistor 324, the solution of FIG. 6 may require significant additional circuitry to generate a reference voltage. Therefore, another embodiment of the present invention creates a solution to the high breakdown current problem by providing a reference voltage with minimal additional circuitry. In FIG. 7 the circuitry is similar to that described in FIG. 6 with the exception that gate 330 of transistor 324 is connected to the source 326 of transistor 324 and also to the drain 322 of transistor 304. Further, transistor 324 is an n-type depletion MOS transistor, meaning that transistor 324 is ion implanted with an n-doped material 333, such as arsenic (As), which causes the threshold, $V_{th}$, of transistor 324 to become approximately −1v (non-depletion NMOS transistors, or "enhancement" NMOS transistors, typically have a $V_{th}$ near 0.8v). Thus, even if the voltage at the gate of transistor 324 is 0 v, transistor 324 may still be "on" (current may flow in its source-drain current path).

During program and erase functions, current will flow from transistor 302 to transistor 304. In this manner transistor 324 will always be turned "on" (the condition for turning on the transistor, $V_{gate} - V_{th} > V_{source}$, will always be true), and the voltage resulting at drain 322 of transistor 304 will be held relatively constant. Thus, transistor 324 acts like a "smart" resistor, automatically limiting the current that passes through it without having to independently evaluate and adjust $V_{ref}$. The voltage at drain 322 of transistor 304 will be held near its breakdown voltage (approximately 8v) and in this manner, substrate current can be held to between approximately 1 and 10 µA. FIG. 5 graphically illustrates a characteristic curve for substrate current versus $V_{ssp}$. Characteristic curve 152 depicts how current will be limited as $V_{ssp}$ is raised above breakdown voltage ($V_{BD}$).

Figure 8:
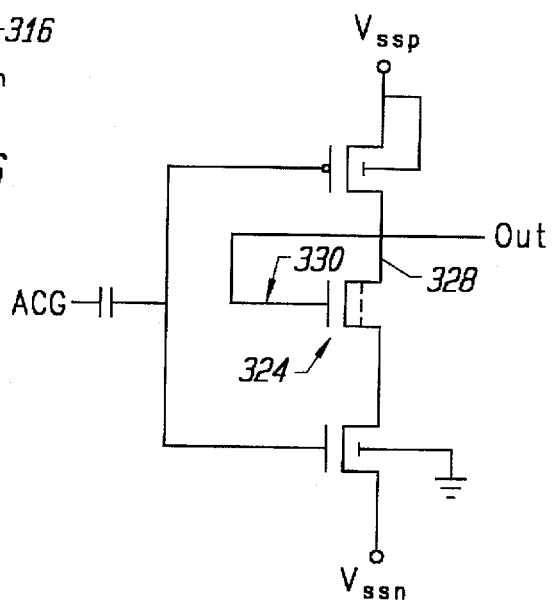
FIG. 8 is a schematic representation of a third embodiment of the present invention.

FIG. 8 depicts yet another embodiment of the invention, and is similar to the embodiment described in FIG. 7, except gate 330 of transistor 324 is coupled to the drain 328 of transistor 324. This embodiment also provides current control as shown in FIG. 5 at curve 154.

Figure 9:
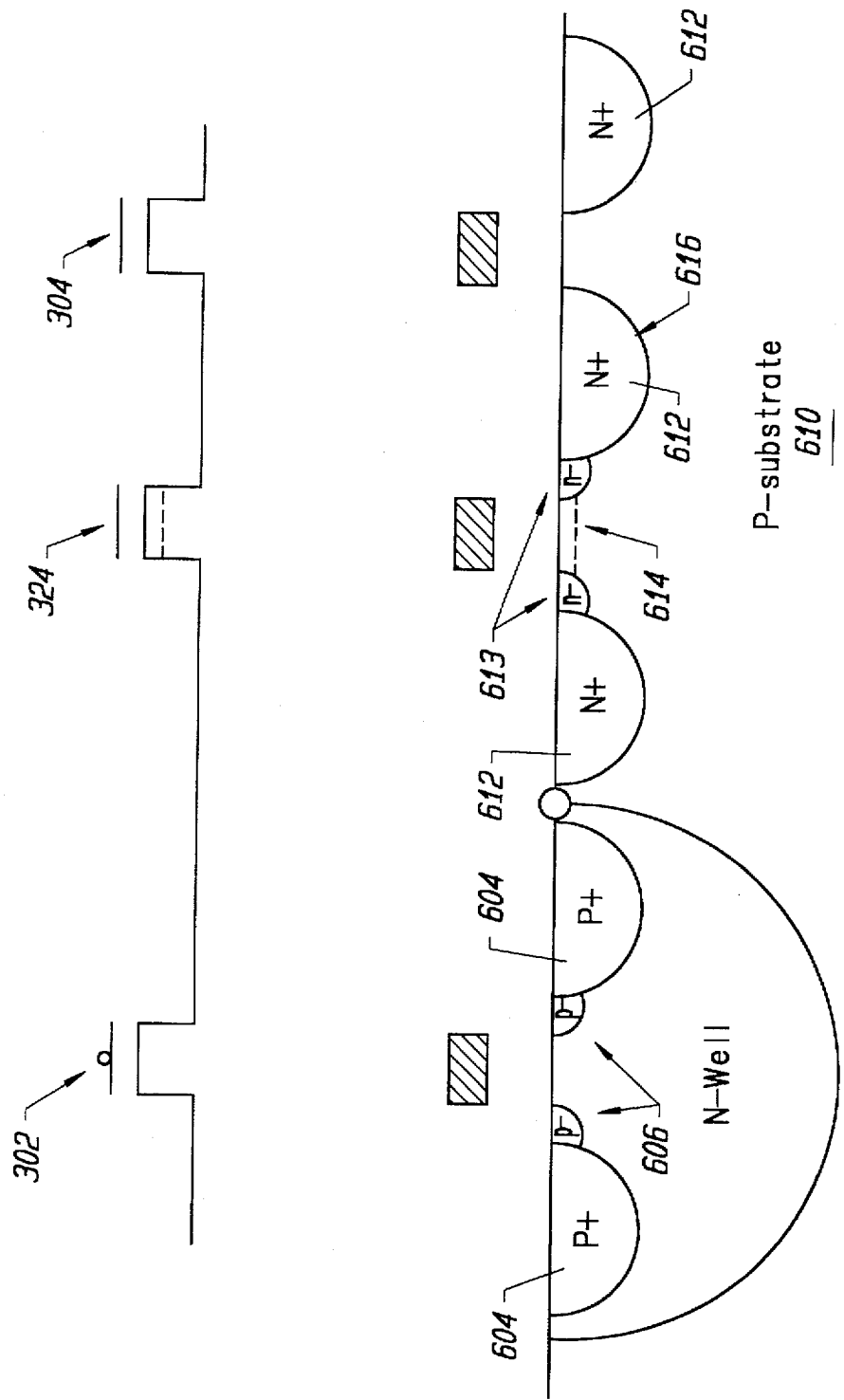
FIG. 9 is a partial, cross-sectional representation of a constructional model of the present invention.

FIG. 9 is a partial cross-sectional constructional diagram of the present invention. Transistor 302 is composed of an N$^+$-doped well 602; two P$^+$-doped wells 604, as well as two p$^-$ spacers 606. Transistor 324 is set on a P-substrate 610 and is composed of N$^+$ wells 612 as well as n− spacers 613. Transistor 324 also has an ion implanted region 614, typically implanted with an n-type material, which may be arsenic (As). Transistor 304 is set on P-substrate 610, and has N$^+$ wells 612. However, transistor 304 contains no spacer (i.e., no n$^-$/p$^-$ doping). Lack of such a spacer reduces the breakdown voltage required to reach avalanche conditions, thus making this array cell a low power device during program and erase.

In operation to erase the array cell 300 shown in FIGS. 7 and 8 using AHE injection, (i.e., to add electrons to the floating gate 318) a voltage, typically between 7 and 12 volts, preferably 10 volts, should be applied to source 306 of transistor 302. A voltage equal to or higher should be applied to the ACG 321, preferably 10 to 11 volts. Best operation has been found when the source 316 is left floating, although grounding source 316 may also work. Substrate 312 of transistor 304 should be brought to a voltage substantially lower than that applied to ACG 321, preferably ground. With the above voltages applied, the p-n junction 616 (shown in FIG. 9) becomes reverse-biased, and electrons will "inject" onto the floating gate through the p-n junction.

To program array cell 300, using AHH injection (i.e., to add holes to the floating gate 318) a voltage, typically 7 to 12 volts, and preferably 10 volts, should be applied to source 306 of transistor 302. Source 316 of transistor 304, like above, is best left floating. Substrate 312 of transistor 304 should also be brought to a relatively low voltage, preferably ground. ACG 321, however, should also be brought to a relatively low voltage, similar to substrate 312, and preferably ground. Similar to erasing, the p-n junction 616 (shown in FIG. 9) becomes reverse-biased, and holes generated at the p-n junction will "inject" to the floating gate.

By using a CMOS cell structure, the present invention consumes low power during read. For examples referring to FIGS. 7 and 8, during a read operation, source 306 of transistor 302 ($V_{ssp}$) will typically be held at voltage $V_{cc}$, the ACG voltage will be held at ½ $V_{cc}$ and the source 316 of transistor 304 ($V_{ssn}$) will typically be held to ground. It is further assumed that in a non-programmed and non-erased state the threshold of transistors 302 and 304 are ½ $V_{cc}$. If the floating gate 318 is then programmed (positively charged), during read transistor 304 will be turned "on" and transistor 302 will be turned "off", causing the output to go to a "low" state. Alternatively, if the floating gate is erased (negatively charged) the n-type transistor 304 is turned off, the p-type transistor 302 is turned on, and the output is "high." In either case, current has no path from $V_{cc}$ to ground, thus little to no power will be drawn. Note that other voltages may be applied in place of $V_{cc}$ and the ACG voltage, and particular threshold conditions of transistors 302 and 304 may be set as indicated in U.S. patent application Ser. No. 08/426,741 entitled "Reference For CMOS Memory Cell Having PMOS and NMOS Transistors With a Common Floating Gate" which is incorporated herein by reference.

It should be understood that the particular embodiments described above are only illustrative of the principles of the present invention, and various modifications could be made by those skilled in the art without departing from the scope and spirit of the present invention. For instance, p-type transistors or n-type transistors could be substituted for transistors of the opposite type. Further, all n-type or all p-type transistors could be used, although this may sacrifice zero power operation during read. In addition, while the invention has been described in the context of an array, it is to be understood that such an array could be composed of a single stand-alone cell. Thus, the scope of the present invention is limited only by the claims that follow.

What is claimed is:

1. A CMOS array cell, comprising: transistor, having a floating gate; and a second transistor, having a floating gate, the floating gate of the first transistor being merged with the floating gate of the second transistor;

a third depletion transistor, having a source-drain current path coupled between said first and second transistors, and a gate; and a reference voltage generator coupled to the gate of the third depletion transistor such that current through the third depletion transistor to the second transistor is regulated.

2. The CMOS array cell of claim 1, wherein the reference voltage generator includes a coupling of the gate of the third depletion transistor to the source of the third depletion transistor.

3. The CMOS array cell of claim 1, wherein the reference voltage generator includes a coupling of the gate of the third depletion transistor to the drain of the third depletion transistor.

4. The CMOS array cell of claim 1, wherein:

said first transistor is an enhancement PMOS transistor; and said second transistor is an enhancement NMOS transistor.

5. The CMOS array cell of claim 1, wherein said second transistor is programmed and erased using avalanche hot carrier injection.

6. A CMOS array cell, comprising:

a PMOS transistor, having a floating gate;

an NMOS transistor, having a floating gate, the floating gate of the PMOS transistor being merged with the floating gate of the NMOS transistor, wherein said NMOS transistor floating gate is programmed and erased using avalanche hot carrier injection;

a depletion transistor, having a source-drain current path coupled between said PMOS transistor and said NMOS transistor, and having a gate coupled to said source-drain current path such that current through the depletion transistor to the NMOS transistor is regulated.

* * * * *

UNITED STATES PATENT AND TRADEMARK OFFICE
CERTIFICATE OF CORRECTION

PATENT NO. : 5,754,471
DATED : May 19, 1998
INVENTOR(S) : Peng, et al.

It is certified that error appears in the above-indentified patent and that said Letters Patent is hereby corrected as shown below:

Col. 6, line 8, after "comprising:", insert --a first--.

Signed and Sealed this

Fourth Day of August, 1998

Attest:

BRUCE LEHMAN

Attesting Officer

Commissioner of Patents and Trademarks